(12) United States Patent
Rowley et al.

(10) Patent No.: US 6,603,964 B1
(45) Date of Patent: Aug. 5, 2003

(54) MIXER WITH REDUCED CARRIER FEEDTHROUGH

(75) Inventors: Matthew D. Rowley, Weston, FL (US); David E. Bockelman, Weston, FL (US)

(73) Assignee: Motorola, Inc., Schamburg, IL (US)

( * ) Notice: Subject to any disclaimer, the term of this patent is extended or adjusted under 35 U.S.C. 154(b) by 561 days.

(21) Appl. No.: 09/655,318

(22) Filed: Sep. 5, 2000

(51) Int. Cl.$^7$ .................................................. H04B 1/28
(52) U.S. Cl. ........................ 455/333; 455/326; 327/210
(58) Field of Search .............................. 455/323, 324, 455/326, 333, 207, 208, 209, 293, 314, 315, 316, 189.1; 327/210, 219, 228, 238, 258, 288

(56) References Cited

U.S. PATENT DOCUMENTS

| | | | |
|---|---|---|---|
| 4,947,062 A | 8/1990 | Weiner et al. ............... | 307/529 |
| 5,060,298 A | 10/1991 | Waugh et al. ............... | 455/326 |
| 5,448,772 A | * 9/1995 | Grandfield .................. | 455/333 |
| 5,894,592 A | * 4/1999 | Brueske et al. ............... | 455/86 |
| 6,147,543 A | * 11/2000 | Gailus et al. ................ | 327/355 |
| 6,343,211 B1 | * 1/2002 | Thodesen et al. ........... | 455/317 |
| 2002/0057132 A1 | * 5/2002 | Tomita ........................ | 327/359 |

OTHER PUBLICATIONS

Stoyaert M., et al., "A 2V CMOS cellular Transceiver Front–End," IEEE International Solid–State Circuits Conference Digest of Technical Papers, pp. 142–143, 2000.

Shahani, A., et al., "A 12–mW Wide Dynamic Range CMOS Front–End for a Portable GPS Receiver," IEEE Journal of Solid–State Circuits, vol. 32, No. 12, pp. 2061–2070, Dec. 1997.

Ham, D., et al., "Complete Noise Analysis for CMOS Switching Mixers Via Stochastic Differential Equations," IEEE Custom Integrated Circuits Conference Digest of Technical Papers, pp. 439–442, 2000.

Goud, P., Zelley, C., and Jenshan, L., "A CMOS resistive ring mixer MMICS for GSM 900 and DCS 1800 base station application," in IEEE MTT–S International Microwave Symposium Digest 2000, vol. 1, pp. 521–524.

\* cited by examiner

*Primary Examiner*—Edward F. Urban
*Assistant Examiner*—Thuan T. Nguyen

(57) ABSTRACT

A mixer circuit (100) includes two balanced transmission gate mixers (102, 104). The mixer circuit (100) balances charge injection mechanisms which reduces carrier feedthrough in the preferred embodiment. The inputs signals provided to the second transmission gate mixer (104) are reversed as compared to those provided to the first transmission gate mixer (102). By reversing the forward path through the second transmission gate mixer (104), charge injection parasitics seen by the first transmission gate mixer (102) are canceled by those in the second transmission gate mixer (104).

13 Claims, 4 Drawing Sheets

MIXER WITH REDUCED CARRIER FEEDTHROUGH

TECHNICAL FIELD

This invention relates in general to electrical circuits, and more specifically to mixers.

BACKGROUND

Mixers take two input signals and multiply them together to realize a frequency translation. Standard Gilbert Cell based mixers require some amount of DC (direct current) bias current for nominal operation. This bias current results in an undesired power dissipation and limits low-power performance. This problem is exacerbated when bipolar topologies are utilized and input bias currents are required which dissipate additional quiescent power. Moreover, the bias current cannot simply be scaled down in order to achieve low-power operation. Scaling the currents affects the required loading conditions, frequency response, and gain performance. In extremely low-power/low-current applications, the required passive loads prove unmanageably large and active loads at high frequencies are not currently practical in the art. Gilbert Cell mixers also have a limited output voltage swing based on biasing and load conditions.

The undesired input bias currents associated with bipolar topologies can be eliminated by utilizing CMOS topologies but the unwanted DC bias tail current still remains. Another alternative is to use CMOS switching mixer topologies which solve the DC bias issues but they have high levels of carrier feedthrough due to charge injection and some don't have the capability for rail-to-rail performance. A need thus exists in the art for a mixer circuit that can operate using no input or DC bias current and dissipates essentially no quiescent power while providing rail-to-rail output voltage swing.

BRIEF DESCRIPTION OF THE DRAWINGS

The features of the present invention, which are believed to be novel, are set forth with particularity in the appended claims. The invention, together with further objects and advantages thereof, may best be understood by reference to the following description, taken in conjunction with the accompanying drawings, in the several figures of which like reference numerals identify like elements, and in which:

DETAILED DESCRIPTION OF THE PREFERRED EMBODIMENT

Figure 1:
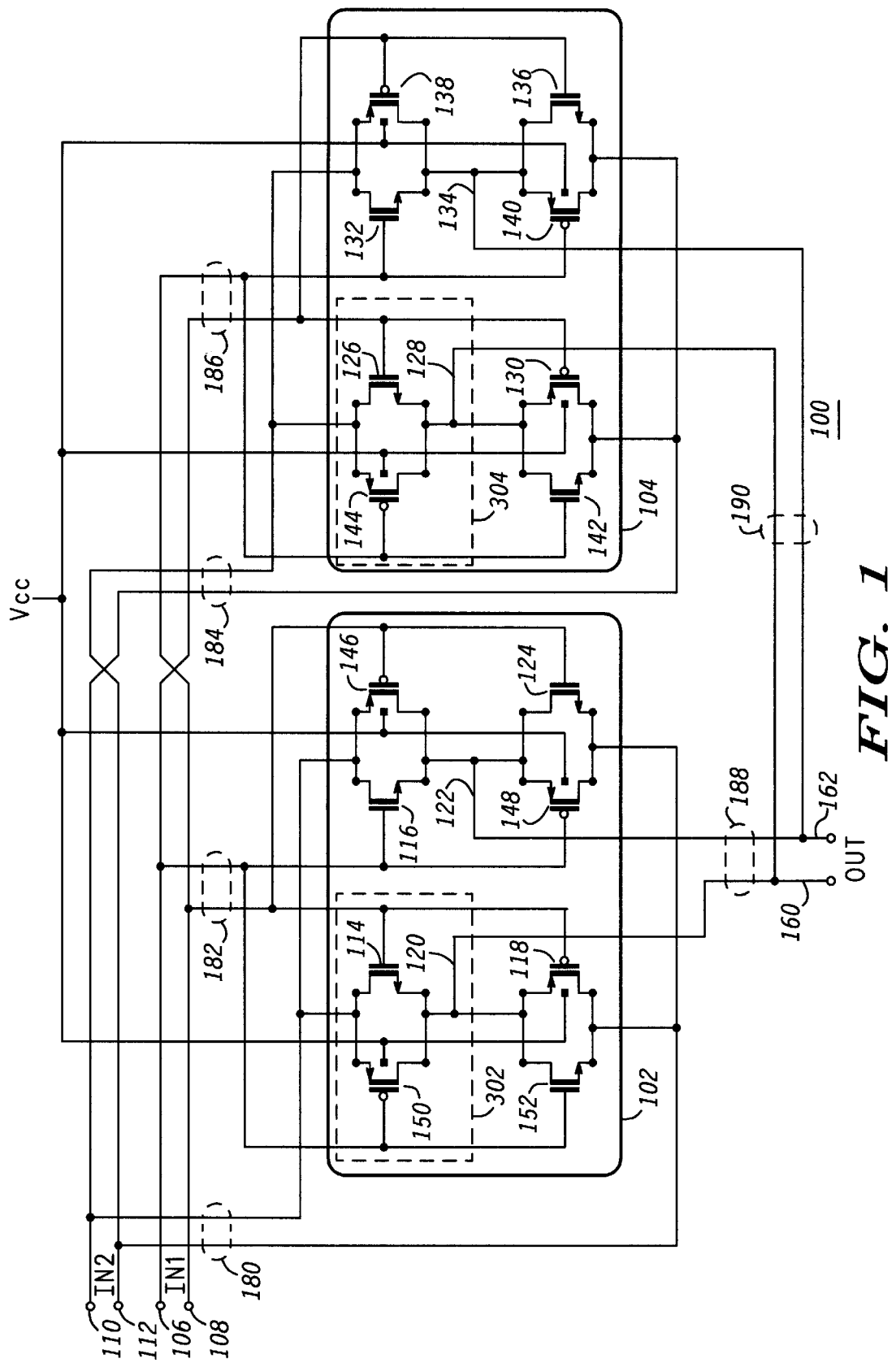
FIG. 1 shows a schematic of a parasitic balanced switching mixer in accordance with the invention.

While the specification concludes with claims defining the features of the invention that are regarded as novel, it is believed that the invention will be better understood from a consideration of the following description in conjunction with the drawing figures, in which like reference numerals are carried forward.

Referring now to FIG. 1, there is shown a mixer circuit 100 having two mixer sets or balanced transmission gate mixers, first transmission gate mixer 102 and second transmission gate mixer 104. First transmission gate mixer 102 includes P type switching devices (or transistors) 150, 118, 148, and 146, and N type switching devices 152, 114, 116, and 124. Second transmission gate mixer 104 includes P type switching devices 144, 130, 140, and 138, and N type switching devices 142, 126, 132, and 136. The switching devices in mixer 100 are used as pass-gate devices also known as transmission gates.

First transmission gate mixer 102 and second transmission gate mixer 104 are topologically identical. A detailed description of the coupling within transmission gate mixer 102 follows. A first transmission gate comprising transistors 150, 114 has an N gate of transistor 114 coupled to a first node 108 of a first input port 182, a P gate of transistor 150 coupled to a second node 106 of the first port 182, a first drain/source node coupled to a first node 110 of the second input port, and a second drain/source node coupled to a first-node 120 of the output port 188. Here, the term "drain/source node" refers to the node formed when a drain or source terminal of one transistor of the transmission gate is connected to a drain or source terminal of the second transistor.

A second transmission gate comprising transistors 152 and 118 has an N gate of transistor 152 coupled to the second node 106 of the first input port 182, a P gate of transistor 118 coupled to the first node 108 of the first input port 182, a first drain/source node coupled to a second node 112 of the second input port 180, and a second drain/source node coupled to the first node 120 of the output port 188.

A third transmission gate comprising transistors 116 and 146 having an N gate of transistor 116 coupled to the second node 106 of the first input port 182, a P gate of transistor 146 coupled to the first node 108 of the first input port 182, a first drain/source node coupled to the first node 110 of the second input port 180, and a second drain/source node coupled to the second node 122 of the output port 188.

A fourth transmission gate comprising transistors 124 and 148, having an N gate of transistor 124 coupled to the first node 108 of the first input port 182, a P gate of transistor 148 coupled to the second node 106 of the first input port 182, a first drain/source node coupled to the second node 112 of the second input port 180, and a second drain/source node coupled to the second node 122 of the output port 188.

Input signal IN2 is coupled by nodes 110 and 112 to source/drain nodes of the switching devices in the mixer sets 102, 104, and can be frequency translated by the mixer circuit 100 with little attenuation to the output nodes 120, 122 from transmission gate mixer 102 and output nodes 128 and 134 from transmission gate mixer 104. The second input to the mixer sets 102, 104 is input IN1 coupled by nodes 106 and 108. In the preferred embodiment IN2 is a differential signal that can be either a baseband or RF signal, and the mixer of the present invention can be used as either an up or down mixer. Also in the preferred embodiment, input IN1 is a differential local oscillator (LO) signal.

IN1 is coupled to a first input port 182 of mixer set 102 and is coupled in an inverted sense to a first input port 186 of mixer set 104. First input port 182 is coupled to the gates of the CMOS transmission gate comprised of transistors 116 and 146 and to the gates of the transmission gate comprised of transistors 148 and 124. The source/drain nodes of transistors 116 and 146 are connected to the source/drain nodes of transistors 148 and 124, forming an output node 122. First input port 182 is coupled to the gates of the transmission gate comprised of transistors 114 and 150 and to the gates of the transmission gate comprised of transistors 152 and 118. The source/drain nodes of transistors 114 and 150 are connected to the source/drain nodes of transistors 152, 118, forming an output node 120. The transmission gates of mixer set 104 are intercoupled in the same manner as the transmission gates of mixer set 102, but IN1 is connected in an inverted sense compared to mixer 102.

IN2 is coupled to a second input port 180 of mixer set 102 and is coupled in an inverted sense to a second input port 184 of mixer set 104. One side 110 of second input port 180 is coupled to the source/drain nodes of the transmission gates formed by transistors 150 and 114 and to the source/drain nodes of transmission gates formed by transistors 116 and 146. The other node 112 of second input port 180 is coupled to the source/drain nodes of transmission gates formed by the transistors 152 and 118 and to the source/drain nodes of the transmission gate formed by transistors 148 and 124. The transmission gates of mixer 104 are connected in the same manner to IN2, but IN2 is connected to mixer 104 in an inverted sense compared to mixer 102. The two output nodes 120 and 122 of transmission gate mixer 102, which form an output port 188 of the transmission gate mixer 102, are connected to the two output nodes 128 and 134 of transmission gate mixer 104, which form an output port 190 of the transmission gate mixer 104 to form an output port OUT of the mixer circuit 100 at terminals 160 and 162. By grouping the two transmission gate mixers 102 and 104 and summing the voltages ($V_{120}$, $V_{1221}$, $V_{128}$, and $V_{134}$) at nodes 120, 122, 128 and 134 as described in equation 1 below, $$V_{OUT}=(V_{120}+V_{128})-(V_{122}+V_{134})\qquad \text{Equation 1:}$$

a balanced output that provides carrier suppression is achieved.

Through proper transistor sizings, transmission gate mixer 102 of FIG. 1 balances charge injection mechanisms between the N and P type devices to the first order, which reduces carrier feedthrough. To further balance the design and improve carrier feedthrough performance even further, transmission gate mixer 104 is added, and the input signals IN1 and IN2 are applied to the first and second input ports 184, 186 of transmission gate mixer 104, one hundred eighty degrees out-of-phase relative to their application to the first and second input ports 180, 182 of transmission gate mixer 102, and the output port 188 of mixer 102 is connected to the output port 190, creating an output OUT. By applying these input signals IN1, IN2 to mixers 102 and 104, one hundred eighty degrees out of phase and connecting the output ports of mixers 102 and 104, charge injection parasitics generated by transmission gate mixer 102 are substantially canceled by those generated by the second transmission gate mixer 104, thereby improving carrier feedthrough performance.

The application of the first and second input signals IN1, IN2 is achieved as shown in FIG. 1 by reversing the differential pair connections to the second mixer 104 with reference to the differential pair connections to the first mixer. However, it will be appreciated by one of ordinary skill in the art that the same result could be achieved using inverting circuitry to invert the first and second input signals that are applied to the second mixer 104.

Figure 2:
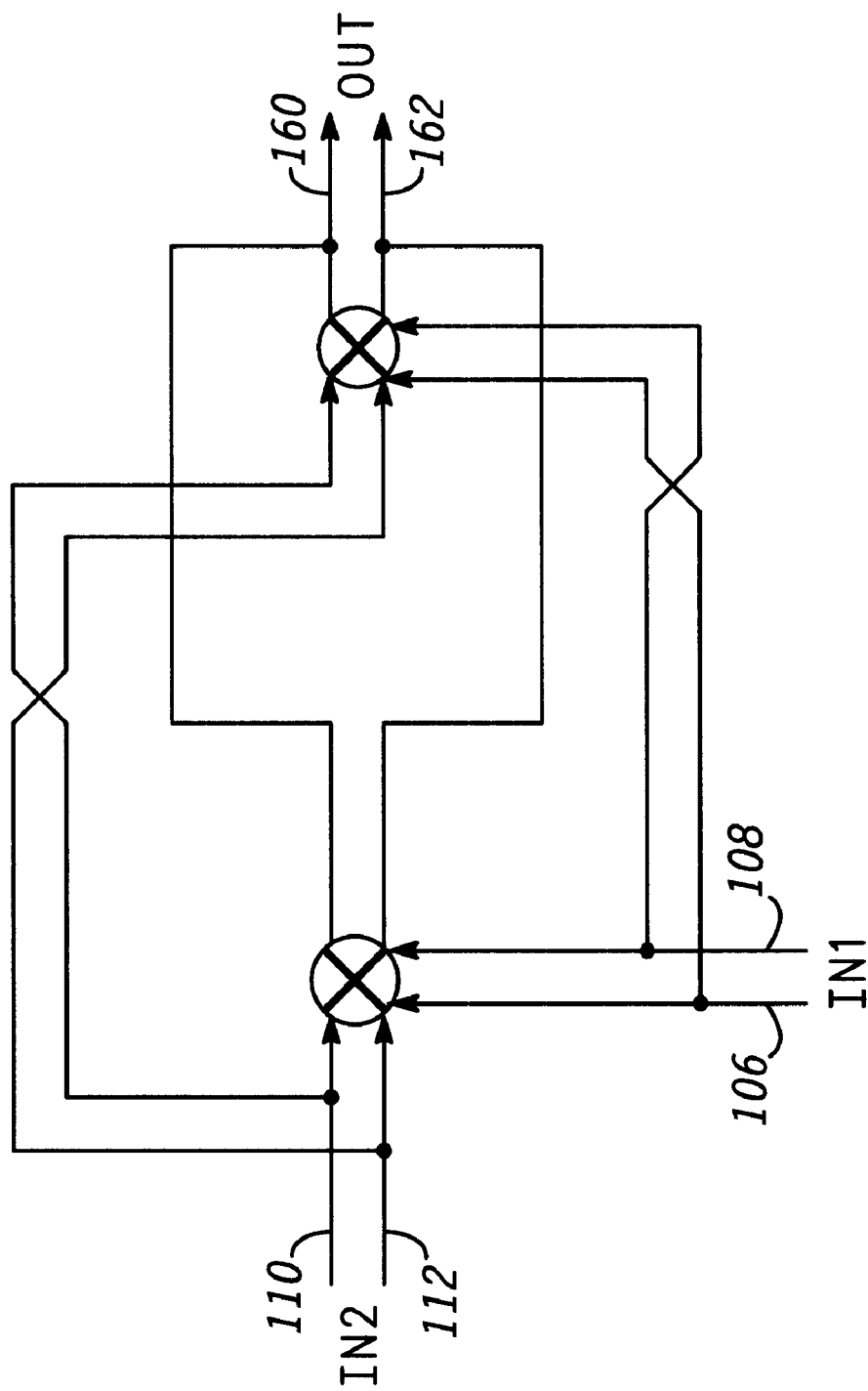
FIG. 2 shows a simplified functional diagram of the mixer of FIG. 1.
Figure 3:
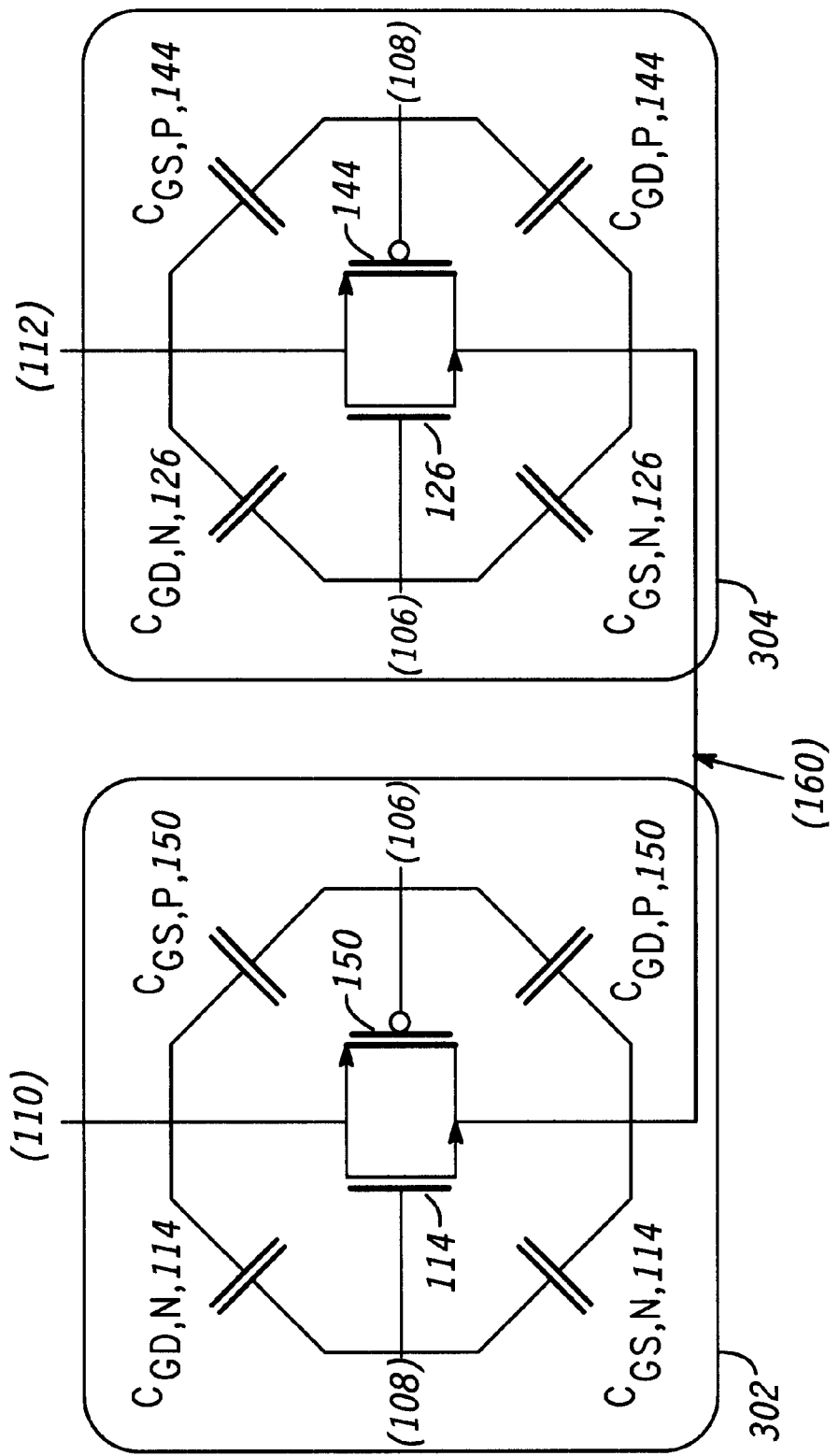
FIG. 3 shows a diagram highlighting the parasitic balancing provided by the mixer of the present invention.

In FIG. 2, there is shown a simplified functional diagram of the mixer of FIG. 1, while in FIG. 3, there is shown switching device sets 302 and 304 that are highlighted in FIG. 1 by dashed lines with the parasitic capacitors delineated. The equations describing the parasitic balancing are as follows:

Capacitance from node 108 to node 160=$C_{GS, N, 114}+C_{GD, P, 144}$ and

Capacitance from node 106 to node 160=$C_{GD, P, 150}+C_{GS, N, 126}$ where $C_{GS, N, 114}=C_{GS, N, 126}$ and $C_{GD, P, 150}=C_{GD, P, 144}$ Therefore based on the above results:

Capacitance from node 106 to node 160=Capacitance from node 108 to node 160     Equation 2

Equation 2 shows that there is substantially complete balancing of parasitics from both nodes 106, 108, to the output node 160. This type of equation can be written for all input to output nodes in the mixer of FIG. 1, showing that there is a matching pair of devices in each mixer that balances all parasitic components. This parasitic balancing is what provides mixer 100 with the improved carrier feedthrough performance.

Figure 4:
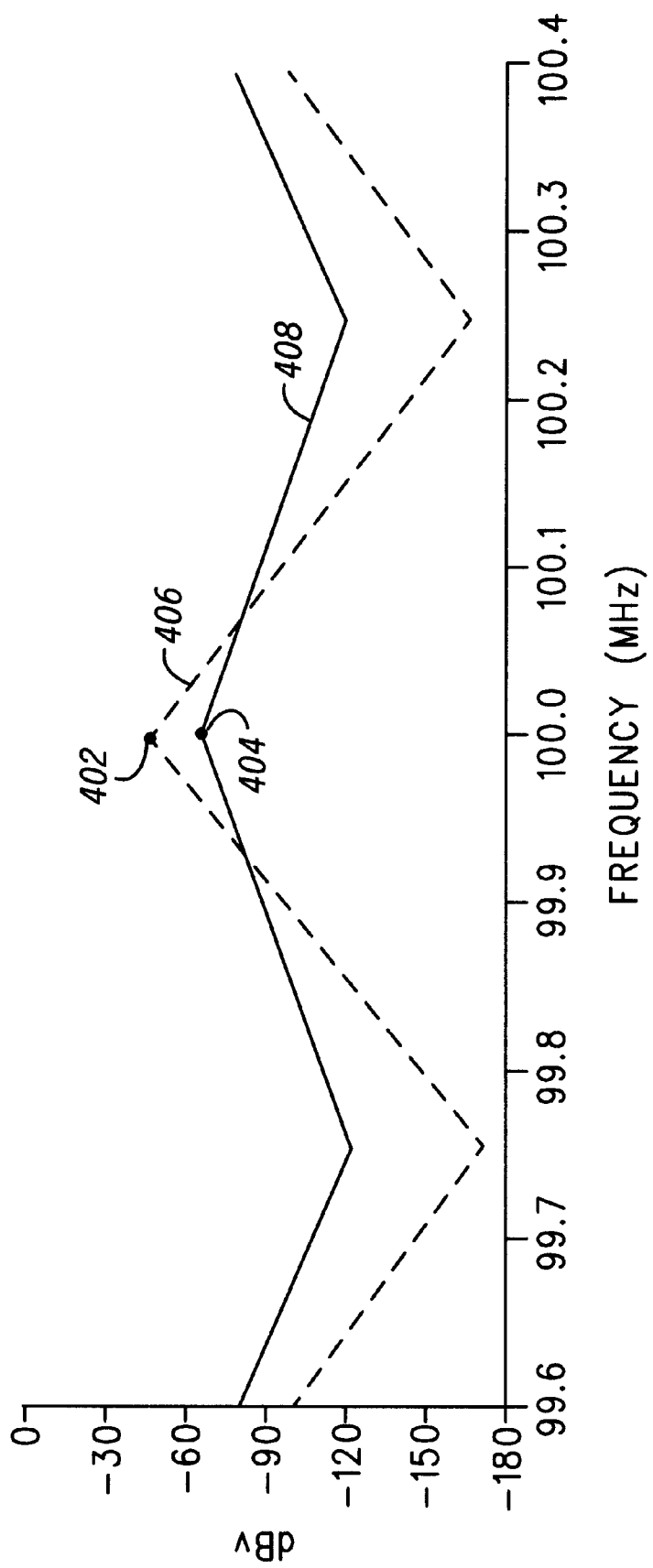
FIG. 4 shows a spectral response for the switching mixer of FIG. 1.

Carrier feedthrough simulation results are highlighted in FIG. 4, where results from the first transmission gate mixer 102 alone are represented by the top line 406, and the results from the composite of the first 102 and second 104 transmission gate mixers with the outputs connected together are represented by the bottom line 408. In the simulation, a baseband signal comprising two input tones was provided as IN2 and the tones were set to 750 mV-peak levels each at 1 MHz and 2.5 MHz respectively, with a DC bias of 1.5 volts. For the simulation, IN1 was generated as a pair of clocks 180 degrees out of phase alternating between 0 and 3 volts at a frequency of 100 MHz coupled to nodes 106 and 108. Results from combining transmission gate mixer sets 102 and 104 show a carrier feedthrough improvement of approximately 20 dB compared to the results from mixer set 102 alone. The carrier feedthrough for the top line at point 402 is approximately −48.3 dBV and for the bottom-line at point 404 is approximately −68.5 dBV. The design topology of the present invention lends itself well to low power supply operation and can easily be implemented in one-volt supply designs. In one implementation, the power consumed by mixer 100 was approximately 15 $\mu$W.

It will be appreciated that the benefits described herein with reference to the preferred embodiments, which are designed for differential inputs and outputs, would be attained in a mixer designed for single ended signals. In a single ended design, a phase shifting circuit would be used to shift the first and second input signals by 180 degrees.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A mixer circuit, comprising:
   a first mixer having an output port, and first and second input ports;
   a second mixer having an output port, and first and second input ports;
   a first input signal coupled to the first input ports of the first and second mixers;

a second input signal coupled to the second input ports of the first and second mixers;

the first input signal coupled to the second mixer has a phase shift substantially equal to 180 degrees relative to the first input signal coupled to the first mixer; and the second input signal coupled to the second mixer has a phase shift substantially equal to 180 degrees relative to the second input signal coupled to the first mixer.

2. A mixer circuit as defined in claim 1, wherein the output ports of the first and second mixers are coupled together to combine the output signals produced by the first and second mixers in order to reduce carrier feedthrough.

3. A mixer circuit as defined in claim 2, wherein the coupling of the output ports adds in phase the output signals from the first and second mixers.

4. A mixer circuit as defined in claim 1, wherein the first and second mixers comprise transmission gate mixers.

5. A mixer circuit as defined in claim 1, wherein the first and second mixer input ports for both the first and second mixers each comprise a pair of terminals and the output port found in each of the first and second mixers comprise a pair of terminals, and the first input signal comprises a first differential signal pair and the second input signal comprises a second differential signal pair.

6. A mixer circuit as defined in claim 5, wherein:

the first differential signal pair coupled to the second mixer is coupled with reversed polarity relative to the first differential signal pair coupled to the first mixer; and the second differential signal pair coupled to the second mixer is coupled with reversed polarity relative to the second differential signal pair coupled to the first mixer.

7. A mixer circuit as defined in claim 6, wherein the output terminal pair of the first mixer is coupled to the output terminal pair of the second mixer with the same polarity.

8. A mixer circuit as defined in claim 5, wherein:

the first output terminal of the terminal pair of the first mixer is connected to the first output terminal of the terminal pair of the second mixer; and the second output terminal of the terminal pair of the first mixer is connected to the second output terminal of the terminal pair of the second mixer.

9. A mixer circuit as defined in claim 1, further comprising:

first and second inverters that provide the phase shift substantially equal to 180 degrees, said first and second inverters are coupled to said first and second input signals and to said second mixer.

10. A mixer, comprising:

a first transmission gate mixer having first and second output terminals;

a second transmission gate mixer having third and fourth output terminals; and the first output terminal is coupled to the third output terminal and the second output terminal is coupled to the fourth output terminal.

11. A mixer as defined in claim 10, further comprising:

a pair of input terminals coupled to the first and second transmission gate mixers, and wherein the pair of input terminals connected to the second transmission gate mixer are reversed relative to how they are connected to the first transmission gate mixer in order to cancel charge injection parasitics found in the first transmission gate mixer.

12. A mixer as defined in claim 10, wherein the first and second transmission gate mixers each include a plurality of pass gate devices.

13. A transmission gate mixer, comprising:

a first input port; a second input port; an output port;

a first transmission gate having an N gate coupled to a first node of the input first port, a P gate coupled to a second node of the first input port, a first drain/source node coupled to a first node of the second input port, and a second drain/source node coupled a first node of the output port;

a second transmission gate having an N gate coupled to the second node of the first input port, a P gate coupled to the first node of the first input port, a first drain/source node coupled to a second node of the second input port, and a second drain/source node coupled to the first node of the output port;

a third transmission gate having an N gate coupled to the second node of the first input port, a P gate coupled to the first node of the first input port, a first drain/source node coupled to the first node of the second input port, and a second drain/source node coupled to the second node of the output port; and a fourth transmission gate having an N gate coupled to the first node of the first input port, a P gate coupled to the second node of the first input port, a first drain/source node coupled to the second node of the second input port, and a second drain/source node coupled to the second node of the output port.

* * * * *